United States Patent
Beer et al.

(10) Patent No.: US 8,990,744 B2
(45) Date of Patent: Mar. 24, 2015

(54) ELECTRICAL MEASUREMENT BASED CIRCUIT WIRING LAYOUT MODIFICATION METHOD AND SYSTEM

(71) Applicant: Infineon Technologies AG, Neubiberg (DE)

(72) Inventors: Gottfried Beer, Nittendorf (DE); Dominic Maier, Pleystein (DE); Gerhard Metzger-Brückl, Geisenfeld (DE); Rainer Leuschner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/863,740

(22) Filed: Apr. 16, 2013

(65) Prior Publication Data

US 2014/0310671 A1    Oct. 16, 2014

(51) Int. Cl.
*G06F 17/50* (2006.01)
(52) U.S. Cl.
CPC ................. *G06F 17/5077* (2013.01)
USPC ............ 716/106; 716/110; 716/111; 716/136
(58) Field of Classification Search
USPC .................... 716/106–111, 132, 136
See application file for complete search history.

(56) References Cited

U.S. PATENT DOCUMENTS

2004/0177492 A1* 9/2004 Eckstein et al. ............. 29/602.1
2008/0150668 A1* 6/2008 Gabara ........................ 336/200

OTHER PUBLICATIONS

Piqué et al. "Laser Direct-Write of Embedded Electronic Components and Circuits." Proceedings SPIE 5713, Photon Processing in Microelectronics and Photonics IV, 223. May 5, 2005. pp. 1-8.
P. Blatt. "Laser Direct Imaging Benefits from Solid State Technology." Laser Assisted Net Shape Engineering 5, Proceedings of the Lane, 2007. pp. 1221-1224.

* cited by examiner

*Primary Examiner* — Paul Dinh
(74) *Attorney, Agent, or Firm* — Murphy, Bilak & Homiller, PLLC

(57) ABSTRACT

The capacitance or inductance of electrical circuits is adjusted by measuring inductance or capacitance values of passive components fabricated on a first substrate, storing individual associations between the passive components and the respective measured values of the passive components, and determining electrical connections for the passive components based on the stored individual associations between the passive components and the respective measured values of the passive components. A corresponding system includes a tester operable to measure inductance or capacitance values of the passive components fabricated on the first substrate, a storage system operable to store the individual associations between the passive components and the respective measured values of the passive components, and a processing circuit operable to determine the electrical connections for the passive components based on the stored individual associations between the passive components and the respective measured values of the passive components.

30 Claims, 6 Drawing Sheets

ELECTRICAL MEASUREMENT BASED CIRCUIT WIRING LAYOUT MODIFICATION METHOD AND SYSTEM

TECHNICAL FIELD

The instant application relates to circuits with passive components, and more particularly to adjusting or modifying the frequency response of circuits with passive components.

BACKGROUND

Discrete passive devices such as capacitors and inductors typically have production tolerances in the range of +/−10% or higher. However, many circuit applications, such as filter networks, require tighter tolerances for capacitor and inductor components included in the circuit. Discrete passive devices are conventionally tested (e.g., by measuring capacitance or inductance) and then sorted into different bins (groups) to ensure that passive devices of the appropriate value (e.g., nominal value +/−3%) are assembled into a circuit to achieve the designed/functional frequency response characteristic. Different nominal values capacitors can be grouped with matched nominal values inductors. However, the sorting process increases cost. For discrete passive devices manufactured using semiconductor technologies such as IPD (integrated passive device) on silicon, the values of the passive devices can be adjusted using fuse elements on the individual device dies. For example, connection lines can be severed by laser cutting based on testing results. Such fusing technology is akin to trimming according to measurements. Once the device dies are positioned on the IPD substrate, the same connections are made for each circuit formed by the different ones of the device dies on the IPD substrate. As such, all capacitance/inductance modifications must be made during wafer processing on individual dies prior to singulation (e.g., sawing) into individual dies and placing on an IPD substrate.

SUMMARY

According to an embodiment of a method of adjusting the capacitance or inductance of passive circuits, the method comprises: measuring inductance or capacitance values of passive components fabricated on a first substrate; storing individual associations between the passive components and the respective measured values of the passive components; and determining electrical connections for the passive components based on the stored individual associations between the passive components and the respective measured values of the passive components.

According to an embodiment of a system, the system comprises a tester operable to measure inductance or capacitance values of passive components fabricated on a first substrate, a storage system operable to store individual associations between the passive components and the respective measured values of the passive components, and a processing circuit operable to determine electrical connections for the passive components based on the stored individual associations between the passive components and the respective measured values of the passive components.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

According to embodiments described herein, passive components such as capacitors and/or inductors fabricated on a substrate such as a semiconductor wafer are tested to measure individual (capacitance or inductance) values of each passive component. The measured values obtained during wafer testing are used later to modify interconnect wiring between different ones of the passive components after the components are separated into individual dies and positioned on a substrate or carrier in which the passive components are to be embedded. Wiring layout modifications made based on the test measurements allow for custom tailoring or tuning of individual circuits formed from the dies, so that each of the circuits has a frequency response that falls within an acceptable range. For example, a standard wiring layout is designed for all circuits of the same type. The standard wiring layout is modified for those circuits with a passive die having a measured value outside an acceptable range, for example by adjusting the capacitance or inductance of the circuit. Such wiring layout modifications are made as needed on a circuit-by-circuit basis, to ensure that all of the circuits meet predetermined design requirements such as frequency response.

Figure 1:
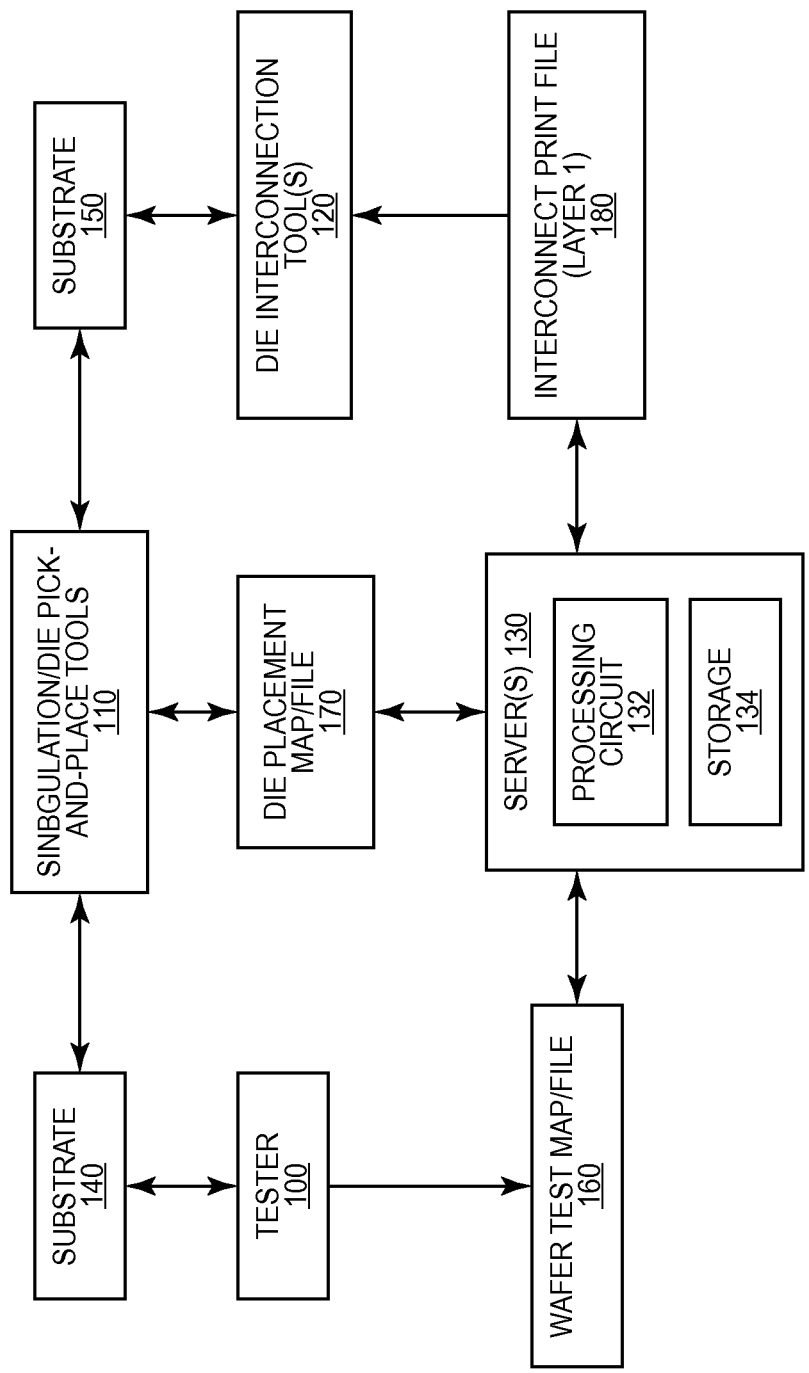
FIG. 1 illustrates a block diagram of an embodiment of a system for manufacturing circuits with passive components.

FIG. 1 illustrates a block diagram of an embodiment of a system for testing passive components fabricated on substrates such as semiconductor wafers, and for manufacturing circuits from individual dies separated from the substrates. The wiring layout of the circuits can be customized or tailored on a per-circuit basis after testing and substrate dicing, based on passive component measurements previously taken during testing. This way, the frequency response or other parameter of each circuit can be individually adjusted or tuned to be within an acceptable range even though some of the circuits may include passive components having individual measurements (inductance or capacitance) outside an acceptable tolerance.

The system includes a tester 100 such as a wafer tester, die singulation/die pick-and-place tools 110, a die interconnect tool 120, and one or more servers 130 having a processing circuit 132, such as a microprocessor, graphics processor, network processor, digital signal processor, ASIC (application-specific integrated circuit), etc. or any combination thereof, and a storage system 134 such as a HDD (hard-disk drive), optical drive, tape drive, SSD (solid-state drive), volatile and/or non-volatile memory, etc. or any combination thereof.

Figure 2:
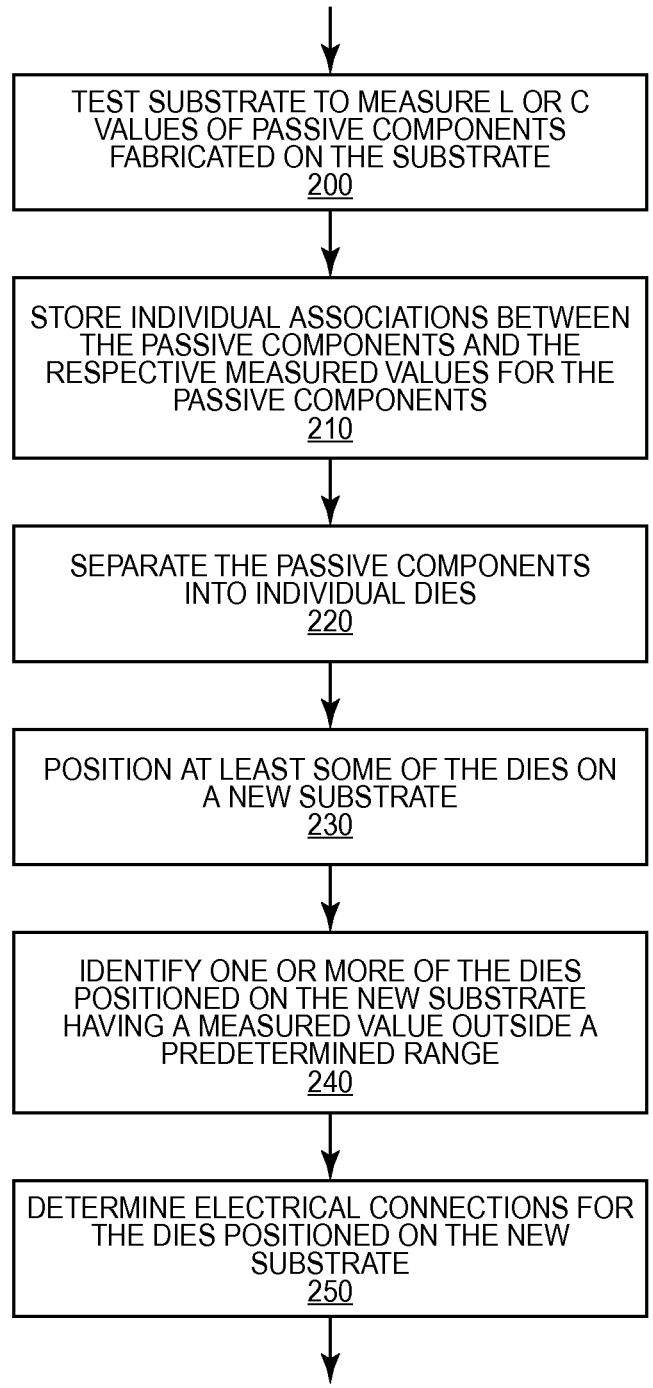
FIG. 2 illustrates a flow diagram of an embodiment of a method of manufacturing circuits with passive components.

FIG. 2 illustrates an embodiment of a manufacturing method carried out by the system of FIG. 1. Operation of the system is described next with reference to the method flow diagram shown in FIG. 2.

The tester 100 is programmed to measure inductance or capacitance values of passive components 142 fabricated on semiconductor wafers or other types of substrates 140 (FIG. 2, Block 200). Any conventional tester 100 can be employed, and any type of planar substrate 140, such as a semiconductor wafer, can be used to fabricate the passive components 142, e.g. a silicon wafer, SiC wafer, ceramic, laminate, etc.

The processing circuit 132 included in the server(s) 130 stores individual associations between the passive components and the respective measured values of the passive components in the storage system 134 (FIG. 2, Block 210). These individual associations are used later to modify the wiring layout of circuits including different ones of the passive components, after the components are separated into individual dies and placed on a second substrate 150 in which the components are to be embedded, such as a substrate core or other type of substrate. In one embodiment, the dies are placed onto a temporary carrier to be embedded by an encapsulant forming the second substrate 150.

Figure 3:
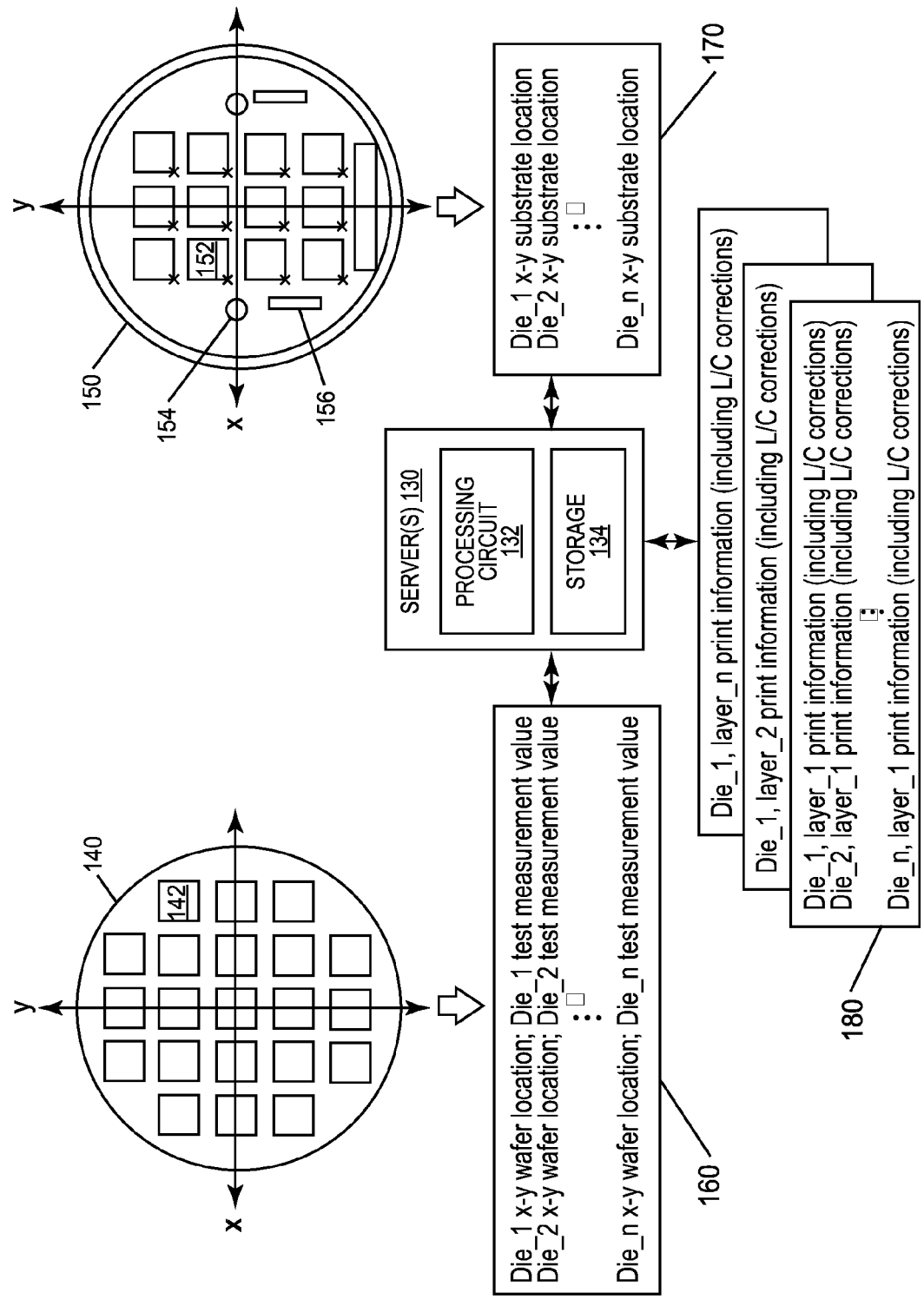
FIG. 3 illustrates a diagram of an embodiment of determining individual associations between passive components and measured values of the passive components.

FIG. 3 illustrates one embodiment where the processing circuit 132 included in the server(s) 130 determines the individual associations by linking or associating an x-y location of each passive component 142 fabricated on the first substrate 140 with the measured value of that passive component 142. The x-y location information is labeled Die_x x-y wafer location' on the left-hand side of FIG. 3, where 'x' corresponds to the xth component 142 fabricated on the wafer 140. The measured values are labeled Die_x test measurement value' on the left-hand side of FIG. 3. In the case of capacitors components 142, this can include associating a capacitance value measured for each of the capacitors 142 with the corresponding x-y location of the capacitors 142 on the substrate 140 in a so-called wafer map or other type of file 160. A wafer map is a type of grid which identifies components 142 by x-y wafer location, and can include test data (e.g., capacitances) associated with the x-y location of each component 142. In the case of a file instead of a wafer map, the individual associations can be stored by creating records in a file such as an ASCII file where each record associates one of the passive components 142 fabricated on the substrate 140 with the actual measured value of that passive component 142.

In another embodiment, the processing circuit 132 included in the server(s) 130 determines the individual associations by linking or associating an ID uniquely assigned to each passive component 142 fabricated on the first substrate 140 with the measured value of that passive component 142. The ID can be an electronic ID stored in the component 142, e.g. by fusing or other type of programming. Alternatively, the ID can be a physical marking such as a bar code, matrix code, or laser scribe on each passive component 142 that can be read, e.g. by a scanner or optical inspection.

Figure 4:
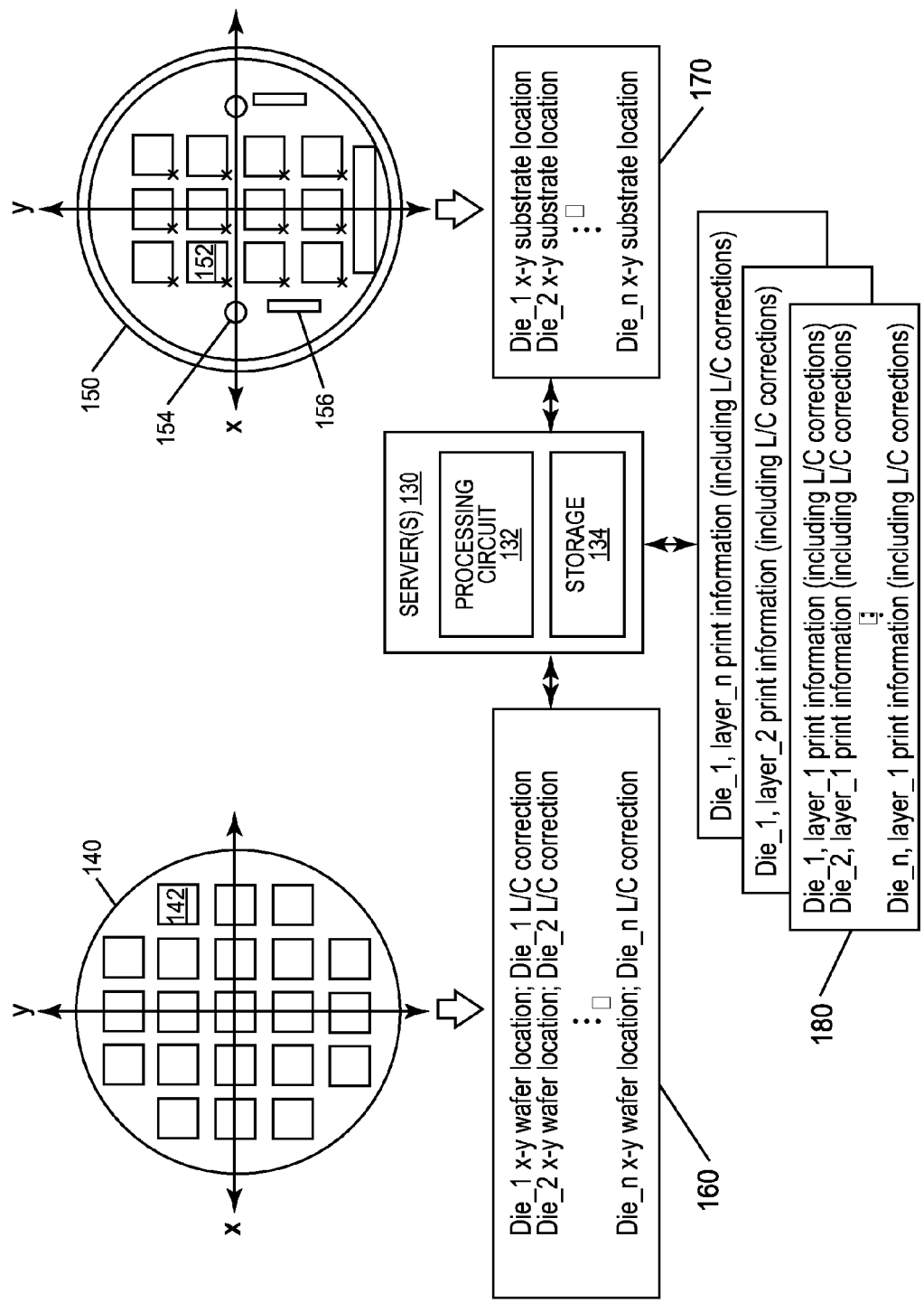
FIG. 4 illustrates a diagram of another embodiment of determining individual associations between passive components and measured values of the passive components.

FIG. 4 illustrates yet another embodiment where the test measurement data is analyzed by the processing circuit 132 included in the server(s) 130 to determine whether any of the passive components 142 on the first substrate 140 has a measurement value outside a predetermined range and therefore requires modification, e.g. an increase or decrease in capacitance or inductance. This determination can be made in the context of the type of circuit(s) for which the passive components 142 are to be integrated. For example, a filter network may have a predetermined frequency response range that depends on the type of application in which the filter network is to be used. The processing circuit 132 can analyze the test measurements obtained for the different passive components 142 to identify each component 142 having a measured value outside a predetermined range e.g. more than +/−3% tolerance. For these passive components 142, some sort of modification (e.g. increase or decrease in capacitance or inductance) will be needed for the circuit in which the component 142 is included to ensure that the circuit operates within a frequency response range. The passive components 142 requiring modification are associated with the corresponding correction information instead of the actual test data according to the embodiment shown in FIG. 4. For example, the x-y location information of each passive component 142 is stored in a wafer map/file 160 and associated with corresponding correction information if applicable. The x-y location information is labeled Die_x x-y wafer location' on the left-hand side of FIG. 4, where 'x' corresponds to the xth component 142 fabricated on the wafer 140. The correction information is labeled Die_x L/C correction on the left-hand side of FIG. 4.

According to the embodiments described herein, wiring layout modifications are made after the passive components 142 are separated (singulated) and placed on or embedded in the second substrate 150. The passive components 142 are depicted as individual singulated dies 152 on the right hand side of FIG. 4. The substrate 150 can have alignment marks 154 and/or other features 156. The processing circuit 132 included in the server(s) 130 makes the wiring layout modifications based on the individual associations stored in the wafer map/file 160, allowing for custom tailoring or tuning of individual circuits formed from the dies 152, e.g. so that each of the circuits has a frequency response that falls within an acceptable range.

With the individual associations stored in the storage medium 134 and after singulation (e.g., wafer dicing tool, FIG. 2, Block 220), the passive components 142 can be translated/transmitted into individual singulated dies 152 on the second substrate 150 by the pick and place tool 110 (FIG. 2, Block 230). In the case of a semiconductor wafer as the first substrate 140, any conventional wafer dicing process can be employed. At least some of the dies 142 are then positioned and correlated as dies 152 on or embedded in the second substrate 150 which can be, e.g., an IPD substrate or other type of substrate (FIG. 2, Block 230). Defective dies 142 are discarded. Any conventional pick-and-place tool 110 can be used to position individual good dies 142 from the first substrate 140 as correlated dies 152 on or embedded in the second substrate 150.

As part of the die placement process, a die placement map/file 170 is created which identifies the x-y position of each singulated die 152 on the second substrate 150 correlated to the corresponding die position on the first substrate 140. In the case of dies 152 without unique IDs, the processing circuit 132 included in the server(s) 130 can track (trace) back the individual dies 152 on second substrate 150 to the corresponding die position on the first substrate 140 post pick and place/embedding via the wafer map/file 160 and with knowledge of where the dies 142 were originally positioned on the first substrate 140 so that a one-to-one mapping or correlation is maintained for each die 152 on a per-substrate (e.g., per-wafer) basis. This way, the processing circuit 132 can uniquely link or map the individual associations (actual test measurements or correction information) in the wafer map/file 160 to the corresponding dies 152 on the second substrate 150. If the dies 152 have unique IDs, the process can be simplified by reading the IDs of the dies 152 positioned on or embedded in the substrate 150 and comparing the IDs to those stored in the wafer map/file 160 to retrieve the corresponding individual associations.

In either case, the processing circuit 132 included in the server(s) 130 identifies one or more of the singulated dies 152 positioned on or embedded in the second substrate 150 having a measured value outside a predetermined range, based on the individual associations between the original die positions on the first substrate 140 and the measured values retrieved from the wafer map/file 160 (FIG. 2, Block 240). In the case of singulated dies 152 without unique IDs, this process can include mapping the x-y locations of the original die positions on the first substrates 140 via the wafer map/file 160 to the positions of the individual die positions on or embedded in the second substrates 150 via the die placement map/file 170 so that the measured value of each singulated die 152 on the second substrate 150 is known. The processing circuit 132 can then identify the dies 152 positioned on or embedded in the second substrate 150 having a measured value outside the predetermined range based on the known measured values of the singulated dies 152, as retrieved from the wafer map/file 160. In the case of singulated dies 152 with unique IDs, this process can include acquiring the ID of each die 152 positioned on or embedded in the second substrate 150 and identifying the dies 152 having a measured value outside the predetermined range based on the measured values retrieved from the wafer map/file 160 and associated with the acquired IDs. In still another embodiment where the individual associations stored in the wafer map/file 160 correspond to the actual correction information to be implemented at the second substrate 150 instead of mere test data, the process can include identifying the singulated dies 152 positioned on or embedded in the second substrate 150 having correction information stored in the wafer map/file 160.

In each case, the processing circuit 132 included in the server(s) 130 then determines the electrical connections (lay outs) for the singulated dies 152 positioned on or embedded in the second substrate 150 (FIG. 2, Block 250). The electrical connections (lay outs) determine how the different dies 152 are to be routed to form independent circuits. At least some of the electrical connections are designed to correct for the measured values of the dies 152 that fall outside a predetermined range. These corrections are made on an individual circuit basis, and are implemented by modifying the wiring layout of the affected circuits. For example, a standard predetermined wiring layout can be provided for each circuit type of the same kind. The processing circuit 132 modifies the standard wiring layout for those circuits having one or more dies 152 identified as having a measured value outside a predetermined range, based on the individual associations retrieved from the wafer map/file 160. The processing circuit 132 creates or modifies an interconnect print file 180, which includes the layout information for each wiring layer fabricated/exposed by the die interconnection tool 120. If the singulated dies 152 integrated as part of the same circuit have corresponding test measurements which fall within an acceptable predetermined range, no change is needed to the standard wiring layout. However, for those singulated die(s) 152 having a measurement value outside a predetermined range, the interconnect print file 180 is modified where appropriate for each layer of the wiring layout so that the resulting circuit has a frequency response which falls within a predetermined range.

Any mask-less die interconnect tool 120 can be used to realize the actual wiring connections for each circuit formed on the second substrate 150, based on the wiring layout information in the interconnect print file 180. Any subtractive or semi-additive technology can be used. For example in the case of eWLB (embedded wafer level ball grid array) technology, the second substrate 150 can be a casting compound in which the singulated dies 152 are embedded (so-called reconstitution layer using semi-additive technology). The electrical connections from pads of the singulated dies 152 to the interconnects are realized in thin-film technology, like for any other classical wafer level packaging technology. The die interconnection tool 120 can implement LDI (laser direct imaging) to form the interconnects. In LDI, a laser is used to image/expose a pattern directly on to a photoresist-coated panel. LDI is used instead of a traditional photo-tool. In the most common LDI implementation, a UV-laser with a dedicated beam delivery is used and modulated to scan across a panel. LDI can be used to pattern/expose the die interconnects for each circuit in accordance with the wiring layout in the interconnect print file 180 for that substrate 150 and layer (if multiple layers are used).

Alternatively, the die interconnection tool 120 can implement LDW (laser direct-write). LDW is a general term that encompasses modification, subtraction and addition processes that can create patterns of materials directly on substrates 150 without the need for lithography or masks. The interaction of the laser with the substrate 150, or any other surface, results in material modification (melting, sintering, etc.) or material removal (laser micromachining). LDW can be used to pattern the die interconnects for each circuit in accordance with the wiring layout in the interconnect print file 180 for that substrate 150 and layer (if multiple layers are used).

Alternatively, the interconnect tool 120 can make use of ink jetting technology to print a conductive ink pattern directly to the second substrate 150 according to the print file 180 for each singulated die 152.

Alternatively, using subtractive pattern technology the interconnect tool 120 can make use of ink jetting technology to print directly etch resist onto the second substrate 150 according to the print file 180.

In yet another embodiment, the die interconnection tool 120 can form circuits from the individual (non-singulated) dies 142 using redistribution layer (RDL) technology. RDL involves the addition of metal and dielectric layers onto the surface of a wafer 140 to re-route the I/O (input/output) layout. RDL uses thin film polymers (e.g., Benzocyclobutene, polyimide, Asahi Glass ALX) and metallization (e.g., Ti, W, Al, Cu, etc. or/and metal stacks) to re-route pads of the non-singulated dies 142 to any configuration. The redistribution trace can be fabricated directly on the primary passivation (e.g., SiN or SiON) or can be routed over a second layer of polymer to add additional compliancy. The interconnects for each circuit can be implemented using a redistribution trace patterned in accordance with the wiring layout in the interconnect print file 180 for that wafer 140 and layer (if multiple layers are used).

In each case, the processing circuit 132 included in the server(s) 130 can use the x-y wafer location information from the wafer map/file 160 in conjunction with the x-y substrate location information from the die placement map/file 170 to uniquely identify each passive singulated die 152 on the second substrate 150 and retrieve the corresponding capacitance or inductance value previously measured for each component 142 during wafer testing as shown in FIG. 3. The x-y substrate location information is labeled Die_x x-y substrate location' on the right-hand side of FIG. 3, where 'x' corresponds to the xth die 152 positioned on or embedded in the substrate 150. According to this embodiment, the processing circuit 132 determines whether any modifications to the wiring layout are necessary for the individual circuits to be formed from the different singulated dies 152 positioned on or embedded in the second substrate 150, e.g. in order to ensure each circuit operates in a predetermined frequency response range. For example, the processing circuit 132 accesses the wafer map/ file 160 and identifies each singulated die 152 positioned on or embedded in the substrate 150 having a measured value outside a predetermined range. The processing circuit 132 then determines a modification for the wiring layout of each circuit that includes one of these singulated dies 152, so that the circuits operate as desired after the corresponding wiring layout modification is implemented. The wiring layout modification associated with each singulated die 152 of interest is recorded in the interconnect print file 180. The wiring layout information contained in the interconnect print file 180 is labeled Die_x, layer_y print information' on the bottom of FIG. 3, where 'x' corresponds to the xth singulated die 152 positioned on or embedded in the second substrate 150 and 'y' corresponds to the yth interconnect layer (if multiple layers are used). The modification information stored in the interconnect print file 180 is labeled '(including L/C corrections)' in FIG. 3.

In another embodiment, the processing circuit 132 included in the server(s) 130 uses the x-y wafer location information from the wafer map/file 160 in conjunction with the x-y substrate location information from the die placement map/file 170 to uniquely identify each passive die 152 on the second substrate 150 and retrieve corresponding correction information previously stored for each component 142 as shown in FIG. 4. According to this embodiment, the processing circuit 132 determines whether any modifications to the wiring layout are necessary for the individual circuits to be formed from the different singulated dies 152 positioned on or embedded in the second substrate 150, e.g. in order to ensure each circuit satisfies a target frequency response range. For example, the processing circuit 132 accesses the wafer map/file 160 and identifies each singulated die 152 positioned on or embedded in the second substrate 150 having previously determined modification information. The processing circuit 132 then makes a corresponding adjustment to the wiring layout for each circuit that includes one of these dies 152. The wiring layout modification associated with each singulated die 152 is recorded in the interconnect print file 180 by the processing circuit 132.

In each case, the die interconnection tool 120 forms the interconnections for the singulated dies 152 on the second substrate 150 in accordance with the wiring layout recorded in the interconnect print file 180. The wiring layout for one or more of the circuits may have been modified as described previously herein, if one or more of the singulated dies 152 positioned on or embedded in the second substrate 150 has a measurement value outside a predetermined range, as indicated by the corresponding individual associations in the wafer map/file 160.

Figure 5C:
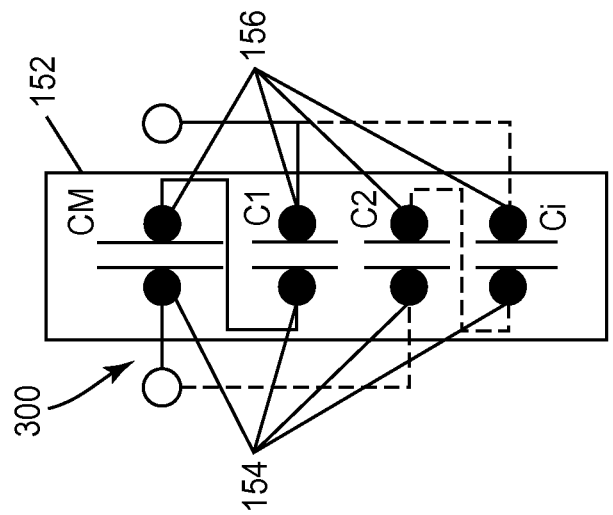
FIGS. 5A through 5C illustrate different capacitor dies and corresponding circuit wiring layouts.
Figure 5B:
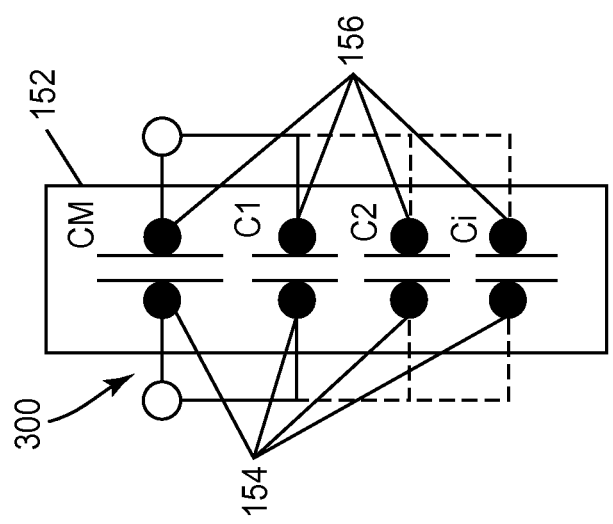
Figure 5A:
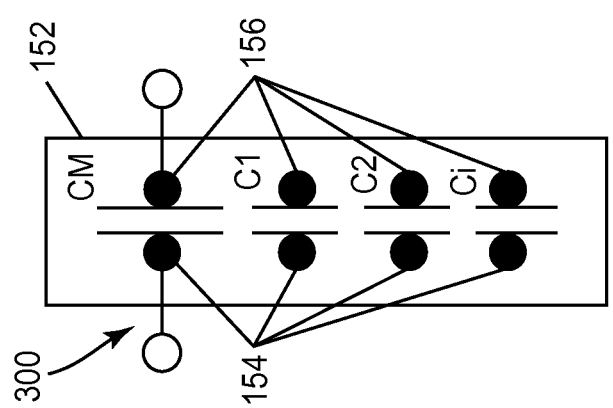

FIGS. 5A through 5C illustrate capacitors on dies 152 that can be differently interconnected on a substrate 150 to form different circuits. Each capacitor element on die 152 includes a main capacitor (CM) and one or more auxiliary capacitors (C1, C2, . . . , Ci). The auxiliary capacitor(s) can have the same or different capacitance as the main capacitor. The capacitors included in the same capacitor die 152 are electrically disconnected from each other in the die 152. Each capacitor included in the same die 152 has a separate pair of terminals 154, 156. The main capacitor CM shown in FIG. 5A was tested at wafer level prior to dicing, and has a measured capacitance value within a predetermined range. As such, the die 152 shown in FIG. 5A does not require any modification, and therefore only the terminals 154, 156 of the main capacitor CM are connected by the circuit wiring 300.

The main capacitor CM and the auxiliary capacitors shown in FIG. 5B were tested at wafer level prior to dicing, and the main capacitor has a measured capacitance value below the predetermined range. As such, the die 152 shown in FIG. 5B requires modification. In one embodiment, the standard circuit wiring 300 shown in FIG. 5A is modified to connect at least one of the auxiliary capacitors (C1 in FIG. 5B) in parallel with the main capacitor (CM) to increase the total capacitance of the die 152. Additional ones of the auxiliary capacitors can be connected in parallel by further modifying the circuit wiring 300, as indicated by the dashed lines in FIG. 5B.

The main capacitor CM shown in FIG. 5C was tested at wafer level prior to dicing, and has a measured capacitance value above the predetermined range. As such, the die 152 shown in FIG. 5C also requires modification. In one embodiment, the standard circuit wiring 300 shown in FIG. 5A is modified to connect at least one of the auxiliary capacitors (C1 in FIG. 5C) in series with the main capacitor (CM) to decrease the total capacitance of the die 152. Additional ones of the auxiliary capacitors can be connected in series by further modifying the circuit wiring 300, as indicated by the dashed lines in FIG. 5C.

In one embodiment the nominal value of the main capacitor CM is chosen so that its maximal value due to production tolerances is the ideal value of the designed circuit. Based on the measured values of CM and C1 . . . Ci the ideal circuit wiring 300 can be calculated by the processing circuit 132. The ideal circuit wiring 300 can be realized by parallel and/or serial connections of CM to Ci.

In one embodiment the adjustment to values of corresponding die 142 is done at the wafer level by redistribution technology as described previously herein.

Figure 6A:
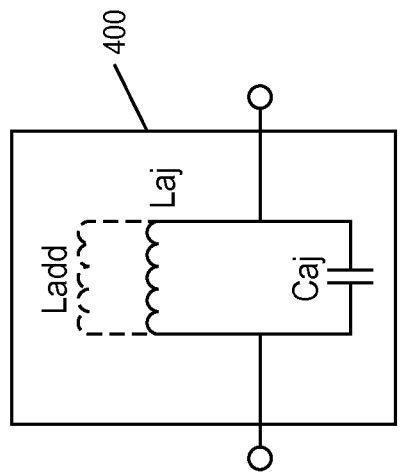
FIGS. 6A and 6B illustrate LC circuits and corresponding circuit wiring layouts.
Figure 6B:
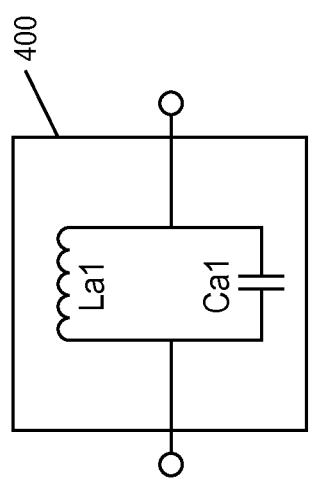

FIGS. 6A and 6B illustrate circuits 400, such as oscillator circuits, each including a capacitor die (Cax) connected in parallel with an inductor (Lax). The inductor can be a discrete die, integrated in an IPD, or implemented as part of the circuit wiring. In each case, the overall inductance of each circuit 400 can be modified by the processing circuit 132 resulting in an individual interconnect print file 180 to adjust the oscillator frequency to a predetermined range so larger tolerances of the nominal values may be permitted, thereby providing cost reduction.

The circuit 400 of FIG. 6A formed by capacitor Cal of die 152 has an ideal inductor La1 (for the desired frequency response) calculated by the processing unit 132, resulting in an individual interconnect print file 180 (e.g., number of windings, diameter, line width/space, etc.).

The circuit 400 of FIG. 6B formed by capacitor Caj in parallel with inductor Laj has a frequency response outside the predetermined range. As such, the standard wiring layout initially designed for the circuit 400 is modified so that the frequency response is within an acceptable tolerance. Instead of modifying the capacitor die, e.g. by wiring one or more auxiliary capacitors on the capacitor die in parallel or series with the main capacitor on the capacitor die as previously described herein, an additional inductor (Ladd) is provided as part of the circuit wiring. Additional inductor Ladd is connected in parallel (as depicted in FIG. 6B) and/or serial with inductor Laj to reduce or increase the overall inductance of the circuit 400. With this modification to the wiring layout, the circuit 400 shown in FIG. 6B has a sufficient frequency response.

Figure 7A:
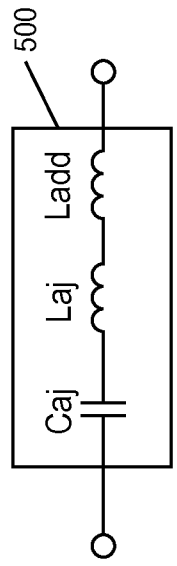
FIGS. 7A and 7B illustrate other LC circuits and corresponding wiring layouts.
Figure 7B:
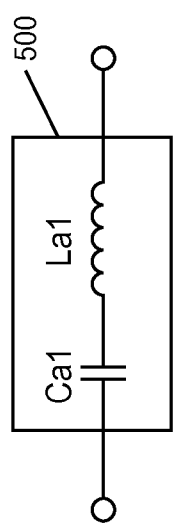

FIGS. 7A and 7B illustrate different circuits 500 such as IPDs each including a capacitor die (Cax) connected in series with an inductor (Lax). The inductor can be a discrete die or implemented as part of the circuit wiring. In either case, the overall inductance of the circuit 500 can be modified to adjust for the capacitor having a measured capacitance outside a predetermined range.

The circuit 500 of FIG. 7A is formed by capacitor Ca1 of die 152 in series with inductor La1. The value of inductor La1 is determined by the corresponding interconnect print file 180 which is determined by the processing unit 132 using the wafer test map/file 160 and the die placement map/file 170. The value of inductor La1 determined by the processing unit 132 results in a frequency response within a predetermined range initially designed for the circuit 500.

The circuit 500 of FIG. 7B formed by capacitor Caj in series with inductor Laj has a frequency response outside the predetermined range. As such, the standard wiring layout initially designed for the circuit 500 is modified so that the frequency response is within an acceptable tolerance. Instead of modifying Caj or Laj of the IPD-die, an additional inductor (Ladd) is formed in the circuit wiring. Additional inductor Ladd is connected in series (as depicted in FIG. 7B) and/o in parallel with inductor Laj to adjust the overall inductance of the circuit 500. With this modification to the wiring layout, the circuit 500 shown in FIG. 7B has a sufficient frequency response.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of adjusting the capacitance or inductance of electrical circuits, the method comprising:
measuring inductance or capacitance values of passive components fabricated on a first substrate to yield measured values of the passive components;
storing individual associations between the passive components and the measured values of the passive components, each of the individual associations linking or associating one of the passive components with the measured value of that passive component;
determining electrical connections for the passive components based on the stored individual associations between the passive components and the measured values of the passive components;
separating the passive components into individual dies;
positioning at least some of the dies on or embedded in a second substrate; and
identifying one or more of the dies positioned on or embedded in the second substrate having a measured value outside a predetermined range, based on the stored individual associations between the passive components and the measured values.

2. The method of claim 1, wherein storing individual associations between the passive components and the measured values of the passive components comprises associating an x-y location of each passive component fabricated on the first substrate with the measured value of that passive component.

3. The method of claim 2, wherein identifying one or more of the dies positioned on or embedded in the second substrate having a measured value outside a predetermined range comprises:
mapping the x-y locations of the passive components fabricated on the first substrate to the positions of the dies on the second substrate so that the measured value of each die positioned on or embedded in the second substrate is known; and
identifying the dies positioned on or embedded in the second substrate having a measured value outside the predetermined range based on the known measured values of the dies.

4. The method of claim 1, wherein storing individual associations between the passive components and the measured values of the passive components comprises associating an ID uniquely assigned to each passive component fabricated on the first substrate with the measured value of that passive component.

5. The method of claim 4, wherein identifying one or more of the dies positioned on or embedded in the second substrate having a measured value outside a predetermined range comprises:
acquiring the ID of each die positioned on or embedded in the second substrate; and
identifying the dies positioned on or embedded in the second substrate having a measured value outside the predetermined range based on the measured values associated with the acquired IDs.

6. The method of claim 1, further comprising implementing the electrical connections in one or more layers disposed on the second substrate above the dies.

7. The method of claim 1, further comprising implementing the electrical connections in one or more layers disposed on the first substrate above the passive components.

8. The method of claim 1, wherein storing individual associations between the passive components and the measured values of the passive components comprises creating records in a file, each record associating one of the passive components fabricated on the first substrate with the actual measured value of that passive component.

9. The method of claim 1, wherein storing individual associations between the passive components and the measured values of the passive components comprises:
identifying the passive components fabricated on the first substrate having a measured value; and
creating records in a file, each record associating one of the passive components having a measured value with an inductance or capacitance adjustment for that passive component.

10. The method of claim 1, wherein determining the electrical connections for the passive components comprises:
determining a wiring layout for connecting a capacitor one of the passive components in series or parallel with an inductor via one or more layers disposed on the first substrate or a different substrate above the passive components; and
modifying the wiring layout to include additional wiring connected in series or parallel with the inductor, so that a passive circuit to be realized from the inductor and the capacitor component based on the modified wiring layout has a frequency response within a predetermined frequency response range.

11. The method of claim 1, wherein determining the electrical connections for the passive components comprises:
determining a wiring layout for at least one inductor in one or more layers disposed on the first substrate or a different substrate, connected in series or parallel to a capacitor one of the passive components, so that a passive circuit to be realized from the inductor and the capacitor component based on the wiring layout has a frequency response within a predetermined frequency response range.

12. The method of claim 1, wherein determining the electrical connections for the passive components comprises:
determining a wiring layout for connecting a capacitor one of the components in series or parallel with an inductor via one or more layers disposed on the first substrate or a different substrate above the passive components; and
modifying the wiring layout to include additional wiring for connecting one or more auxiliary capacitors included in the capacitor component in series or parallel with a main capacitor included in the capacitor component, so that a passive circuit to be realized from the inductor and the capacitor component based on the modified wiring layout has a frequency response within a predetermined range.

13. The method of claim 12, wherein the capacitors included in the capacitor component are electrically disconnected from each other within the capacitor component, wherein each capacitor included in the capacitor component has a separate pair of terminals, and wherein the wiring layout is modified so that the additional wiring connects at least one terminal of an auxiliary capacitor included in the capacitor component to a terminal of the main capacitor included in the capacitor component and at least two of the capacitors included in the capacitor component are electrically connected in series or parallel via the additional wiring.

14. A system, comprising:
a tester operable to measure inductance or capacitance values of passive components fabricated on a first substrate to yield measured values of the passive components;
a storage system operable to store individual associations between the passive components and the measured values of the passive components, each of the individual associations linking or associating one of the passive components with the measured value of that passive component;
a processing circuit operable to determine electrical connections for the passive components based on the stored individual associations between the passive components and the measured values of the passive components; and
one or more tools operable to separate the passive components into individual dies and position at least some of the dies on or embedded in a second substrate,
wherein the processing circuit is operable to identify one or more of the dies positioned on or embedded in the second substrate having a measured value outside a predetermined range based on the stored individual associations between the passive components and the measured values.

15. The system of claim 14, wherein the individual associations between the passive components and the measured values of the passive components comprise an association between an x-y location of each passive component fabricated on the first substrate with the measured value of that passive component.

16. The system of claim 15, wherein the processing circuit is operable to:
map the x-y locations of the passive components fabricated on the first substrate to the positions of the dies on the second substrate so that the measured value of each die positioned on or embedded in the second substrate is known; and
identify the dies positioned on or embedded in the second substrate having a measured value outside the predetermined range based on the known measured values of the dies.

17. The system of claim 14, wherein the individual associations between the passive components and the measured values of the passive components comprise an association between an ID uniquely assigned to each passive component fabricated on the first substrate with the measured value of that passive component.

18. The system of claim 17, wherein the processing circuit is operable to:
acquire the ID of each die positioned on or embedded in the second substrate; and
identify the dies positioned on or embedded in the second substrate having a measured value outside the predetermined range based on the measured values associated with the acquired IDs.

19. The system of claim 14, wherein the one or more tools are further operable to form the electrical connections in one or more layers disposed on the second substrate above the dies.

20. The system of claim 14 further comprising one or more tools operable to form the electrical connections in one or more layers disposed on the first substrate above the passive components.

21. The system of claim 14, wherein the storage system is operable to store individual associations between the passive components and the measured values of the passive components as records in a file, each record associating one of the passive components fabricated on the first substrate with the actual measured value of that passive component.

22. The system of claim 14, wherein the processing circuit is operable to:
identify the passive components fabricated on the first substrate having a measured value; and
create records in a file, each record associating one of the passive components having a measured value with an inductance or capacitance adjustment for that passive component.

23. The system of claim 14, wherein the processing circuit is operable to:
determine a wiring layout for connecting a capacitor one of the passive components in series or parallel with an inductor via one or more layers disposed on the first substrate or a different substrate above the passive components; and
modify the wiring layout to include additional wiring connected in series or parallel with the inductor, so that a passive circuit to be realized from the inductor and the capacitor component based on the modified wiring layout has a frequency response within a predetermined frequency response range.

24. The system of claim 14, wherein the processing circuit is operable to determine a wiring layout for at least one inductor in one or more layers disposed on the first substrate or a different substrate, connected in series or parallel to a capacitor one of the passive components, so that a passive circuit to be realized from the inductor and the capacitor component based on the wiring layout has a frequency response within a predetermined frequency response range.

25. The system of claim 14, wherein the processing circuit is operable to:
  determine a wiring layout for connecting a capacitor one of the components in series or parallel with an inductor via one or more layers disposed on the first substrate or a different substrate above the passive components; and
  modify the wiring layout to include additional wiring for connecting one or more auxiliary capacitors included in the capacitor component in series or parallel with a main capacitor included in the capacitor component, so that a passive circuit to be realized from the inductor and the capacitor component based on the modified wiring layout has a frequency response within a predetermined range.

26. The system of claim 25, wherein the capacitors included in the capacitor component are electrically disconnected from each other within the capacitor component, wherein each capacitor included in the capacitor component has a separate pair of terminals, and wherein the wiring layout is modified so that the additional wiring connects at least one terminal of an auxiliary capacitor included in the capacitor component to a terminal of the main capacitor included in the capacitor component and at least two of the capacitors included in the capacitor component are electrically connected in series or parallel via the additional wiring.

27. A method of adjusting the capacitance or inductance of electrical circuits, the method comprising:
  measuring inductance or capacitance values of passive components fabricated on a first substrate to yield measured values of the passive components;
  storing individual associations between the passive components and the measured values of the passive components, each of the individual associations linking or associating one of the passive components with the measured value of that passive component;
  determining electrical connections for the passive components based on the stored individual associations between the passive components and the measured values of the passive components;
  determining a wiring layout for connecting a capacitor one of the components in series or parallel with an inductor via one or more layers disposed on the first substrate or a different substrate above the passive components; and
  modifying the wiring layout to include additional wiring for connecting one or more auxiliary capacitors included in the capacitor component in series or parallel with a main capacitor included in the capacitor component, so that a passive circuit to be realized from the inductor and the capacitor component based on the modified wiring layout has a frequency response within a predetermined range.

28. The method of claim 27, wherein the capacitors included in the capacitor component are electrically disconnected from each other within the capacitor component, wherein each capacitor included in the capacitor component has a separate pair of terminals, and wherein the wiring layout is modified so that the additional wiring connects at least one terminal of an auxiliary capacitor included in the capacitor component to a terminal of the main capacitor included in the capacitor component and at least two of the capacitors included in the capacitor component are electrically connected in series or parallel via the additional wiring.

29. A system, comprising:
  a tester operable to measure inductance or capacitance values of passive components fabricated on a first substrate to yield measured values of the passive components;
  a storage system operable to store individual associations between the passive components and the measured values of the passive components, each of the individual associations linking or associating one of the passive components with the measured value of that passive component; and
  a processing circuit operable to:
    determine electrical connections for the passive components based on the stored individual associations between the passive components and the measured values of the passive components;
    determine a wiring layout for connecting a capacitor one of the components in series or parallel with an inductor via one or more layers disposed on the first substrate or a different substrate above the passive components; and
    modify the wiring layout to include additional wiring for connecting one or more auxiliary capacitors included in the capacitor component in series or parallel with a main capacitor included in the capacitor component, so that a passive circuit to be realized from the inductor and the capacitor component based on the modified wiring layout has a frequency response within a predetermined range.

30. The system of claim 29, wherein the capacitors included in the capacitor component are electrically disconnected from each other within the capacitor component, wherein each capacitor included in the capacitor component has a separate pair of terminals, and wherein the wiring layout is modified so that the additional wiring connects at least one terminal of an auxiliary capacitor included in the capacitor component to a terminal of the main capacitor included in the capacitor component and at least two of the capacitors included in the capacitor component are electrically connected in series or parallel via the additional wiring.

\* \* \* \* \*